(12) United States Patent
Rao et al.

(10) Patent No.: US 11,631,818 B2
(45) Date of Patent: Apr. 18, 2023

(54) OFETS HAVING MULTILAYER ORGANIC SEMICONDUCTOR WITH HIGH ON/OFF RATIO

(71) Applicant: META PLATFORMS TECHNOLOGIES, LLC, Menlo Park, CA (US)

(72) Inventors: Tingling Rao, Bellevue, WA (US); Lafe Purvis, Redmond, WA (US); Tanya Malhotra, Redmond, WA (US); Andrew John Ouderkirk, Kirkland, WA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 227 days.

(21) Appl. No.: 17/098,493

(22) Filed: Nov. 16, 2020

(65) Prior Publication Data

US 2022/0045280 A1     Feb. 10, 2022

Related U.S. Application Data

(60) Provisional application No. 63/061,971, filed on Aug. 6, 2020.

(51) Int. Cl.
*H01L 51/00* (2006.01)
*H01L 51/05* (2006.01)

(52) U.S. Cl.
CPC ...... *H01L 51/0072* (2013.01); *H01L 51/0012* (2013.01); *H01L 51/0034* (2013.01); *H01L 51/0073* (2013.01); *H01L 51/0074* (2013.01); *H01L 51/0094* (2013.01); *H01L 51/0562* (2013.01)

(58) Field of Classification Search
CPC ............ H01L 51/0072; H01L 51/0073; H01L 51/0074
See application file for complete search history.

(56) References Cited

FOREIGN PATENT DOCUMENTS

| JP | 2004-260121 A | 9/2004 |
|---|---|---|
| WO | 2011039506 A1 | 4/2011 |

OTHER PUBLICATIONS

Yaroshchuk et al., "Photoalignment of liquid crystals: basics and current trends", Journal of Materials Chemistry, 2012, vol. 22, No. 2, Dec. 2011, 16 pages.

International Search Report and Written Opinion for International Application No. PCT/US2021/044402, dated Nov. 18, 2021, 12 pages.

(Continued)

*Primary Examiner* — Anthony Ho
(74) *Attorney, Agent, or Firm* — Greenberg Traurig, LLP

(57) ABSTRACT

An organic field effect transistor includes a channel structure having a photoalignment layer and an organic semiconductor layer disposed directly over the photoalignment layer, where a charge carrier mobility varies along a thickness direction of the channel structure. The channel structure may define an active area between a source and a drain of the transistor and may include alternating layers of at least two photoalignment layers and at least two organic semiconductor layers. Each photoalignment layer is configured to influence an orientation of molecules within an overlying organic semiconductor layer and hence impact the mobility of charge carriers within the device active area while also advantageously decreasing the OFF current of the device.

13 Claims, 11 Drawing Sheets

(56) References Cited

OTHER PUBLICATIONS

Sakamoto K., et al., "Anisotropic Field-Effect Hole Mobility of Liquid Crystalline Conjugated Polymer Layers Formed on Photoaligned Polyimide Films," Journal of Applied Physics, vol. 109, No. 1, Jan. 3, 2011, 8 pages.

Sakamoto K., et al., "Light Exposure Dependence of Field-Effect Mobility of Pentacene Thin Films Deposited on very Thin Polyimide Photo-Alignment Layers," Journal of Applied Physics, vol. 111, No. 12, Jun. 15, 2012, 9 pages.

Woo J., et al., "Anisotropic Charge-Carrier Mobilities of Liquid Crystalline Conjugated Polymers on Photo-Aligned PVCN Dielectric Insulators," Organic Electronics, vol. 30, Dec. 28, 2015, pp. 143-148.

International Preliminary Report on Patentability for International Application No. PCT/US2021/044402, dated Feb. 16, 2023, 10 pages.

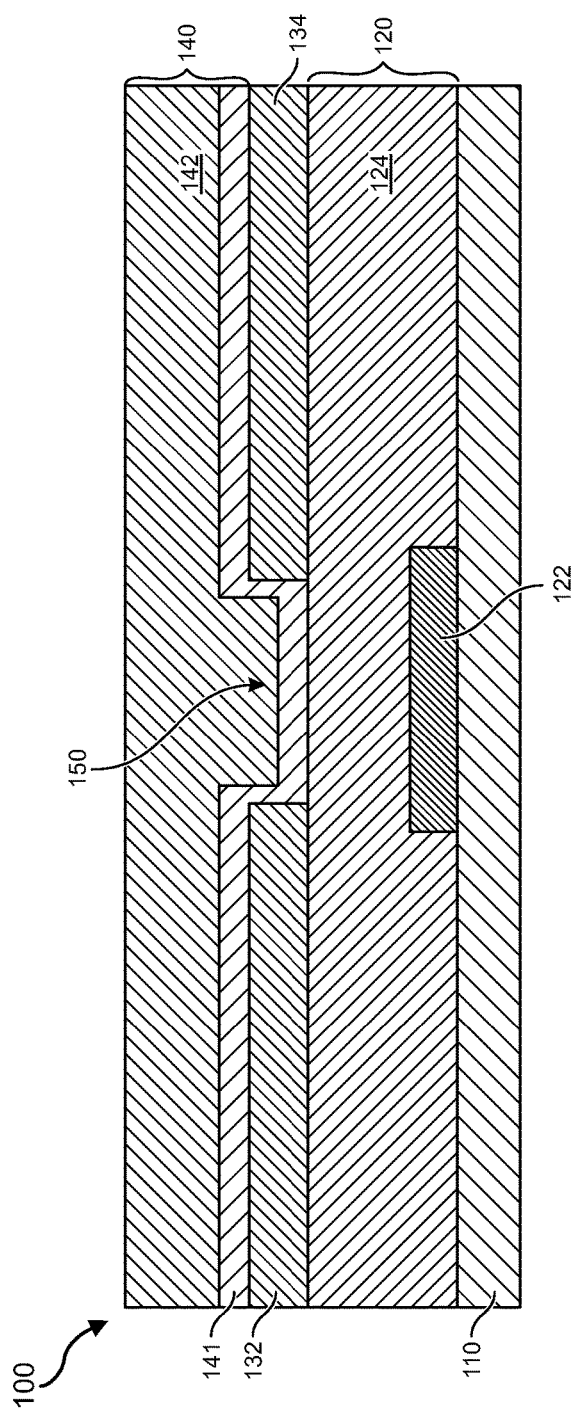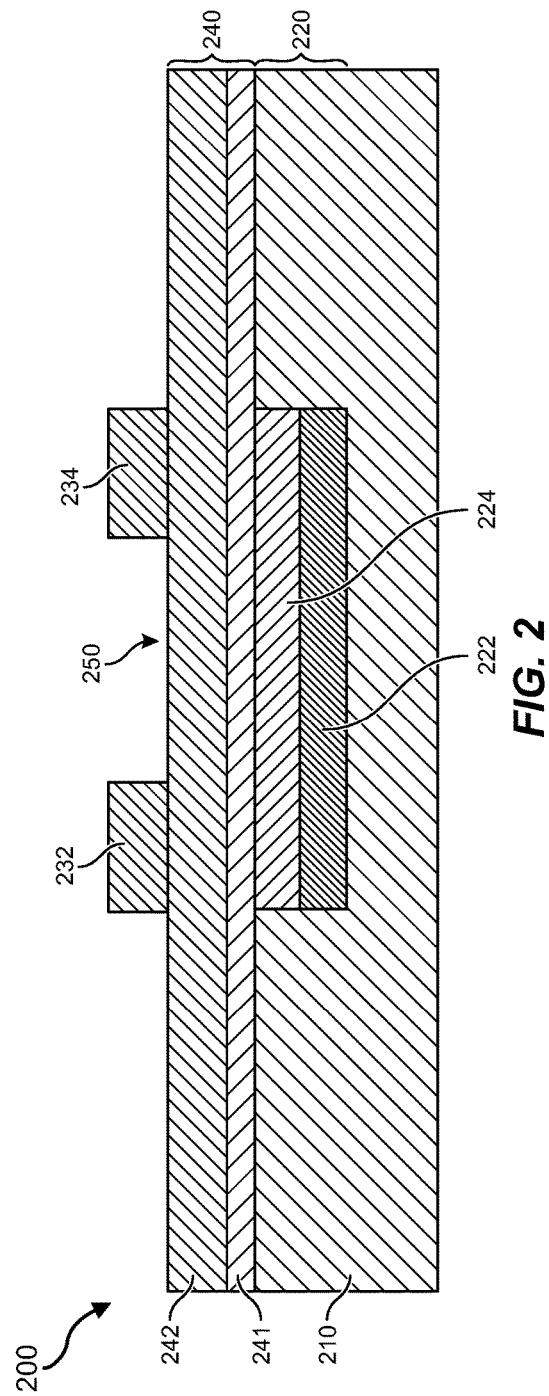

Amino Acids

Sugars n = 0, 1, 2, 3, 4

Fatty Acids/Diacids

Hydrocarbons
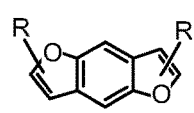
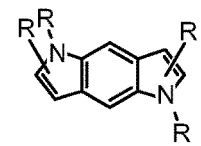
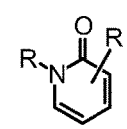
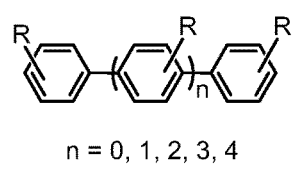
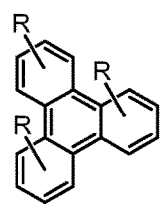
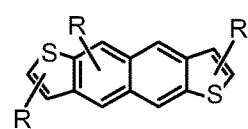
n = 0, 1, 2, 3, 4
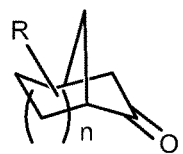
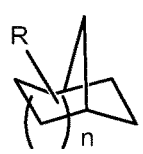
n = 0, 1, 2, 3, 4    n = 0, 1, 2, 3, 4
*FIG. 10*

Anionic Molecules

Cationic Molecules

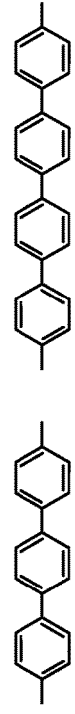
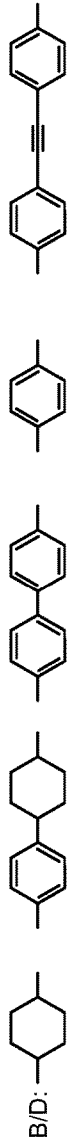
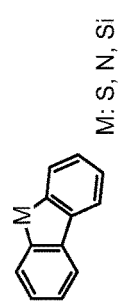
A - B - C - D - E
A: Alkyl, Alkoxy, Alkenyl
B/D:
M: S, N, Si
C: -CH$_2$-  -C$_2$H$_4$-  -(C=C)-  -(N=N)-
E: -CN  -Br  -F  -Cl  -CF$_3$  -SNC  -NCS  -OCF$_3$  -SF$_5$  Alkyl  Alkoxy
mono- or polyfluorinated C1-C10 alkyl
FIG. 14
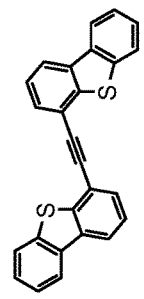
FIG. 15

OFETS HAVING MULTILAYER ORGANIC SEMICONDUCTOR WITH HIGH ON/OFF RATIO

CROSS-REFERENCE TO RELATED APPLICATION

This application claims the benefit of priority under 35 U.S.C. § 119(e) of U.S. Provisional Application No. 63/061,971, filed Aug. 6, 2020, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 1 is a cross-sectional schematic illustration of an organic field effect transistor having a templated organic semiconductor layer and a raised gate according to various embodiments.

FIG. 2 is a cross-sectional schematic illustration of an organic field effect transistor having a templated organic semiconductor layer and a buried gate according to some embodiments.

FIGS. 5-15 depict example crystallizable molecules that may be incorporated into an organic semiconductor layer according to certain embodiments.

Figure 3:
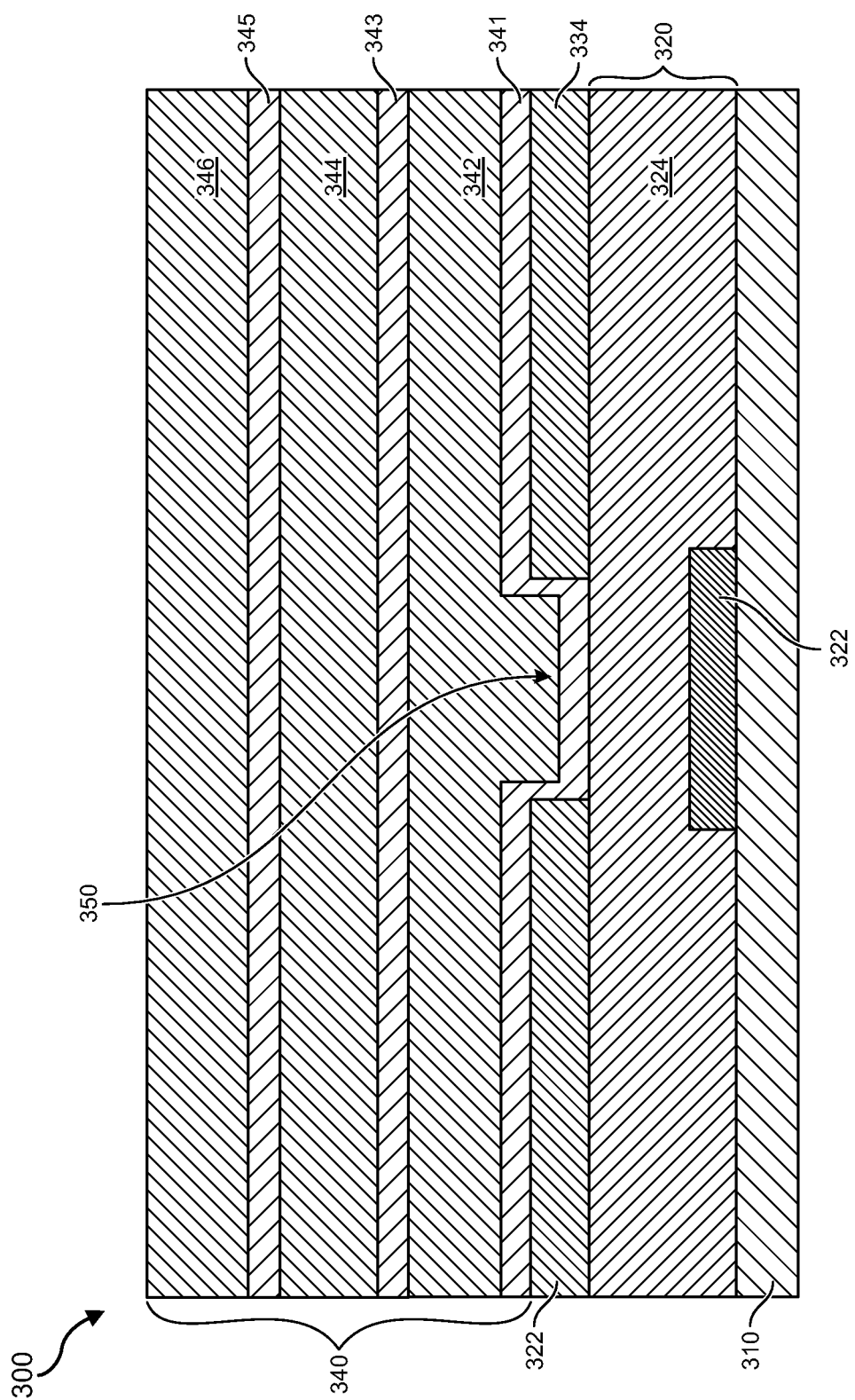
FIG. 3 is a cross-sectional schematic illustration of an organic field effect transistor having a multilayer templated channel structure according to certain embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to organic semiconductor materials, and more particularly to the molecular engineering of organic semiconductor thin films for implementation in organic field effect transistors (OFETs), organic light emitting diodes (OLEDs), organic photovoltaic devices, etc.

In various device architectures, an organic semiconductor layer may be disposed between conductive electrodes, which may include the source and drain of an exemplary logic device. The organic semiconductor layer may be semi-crystalline or a single crystal. The mobility of charge carriers and hence the electrical conductivity within the organic semiconductor layer may be related to the crystallinity and crystalline orientation of the organic semiconductor.

Notwithstanding recent developments, it would be advantageous to provide manufacturing methods and related architectures that enable the formation of organic semiconductor layers and associated devices having a repeatable and reliable alignment of crystal molecules that provide enhanced charge carrier mobility along a pre-designed direction, i.e., along a direction between the source and the drain.

In accordance with various embodiments, an organic semiconductor layer may be formed directly over a photoalignment layer. The photoalignment layer may be used as a templating layer to align crystallites within the organic semiconductor layer during its formation. A stacked architecture including a photoalignment layer and an associated, overlying organic semiconductor layer may be incorporated into a channel structure of an OFET, for example. In some embodiments, a channel structure may include including multiple alternating organic semiconductor and photoalignment layers where the crystalline orientation and hence the charge carrier mobility of each organic semiconductor may be influenced by a respective photoalignment layer.

In a channel structure exhibiting an interlayer (or intralayer) gradient in charge carrier mobility, an overall high charge carrier mobility may be realized, i.e., along a direction between the source and the drain, which appreciably decreasing the OFF current of the associated device. Thus, a multilayer channel structure may beneficially impact the ON/OFF current ratio of an OFET, which is a characterization of the difference between an on-state current and an off-state current of the device.

Transport in organic semiconductors refers to how charge carriers move through a material under the application of an electric field. For instance, transport can refer to the migration of excitons along or between polymer chains and/or crystals and may involve the process of energy transfer from one chain and/or crystal to another.

As will be appreciated, the function and performance of an organic device is typically related to the mobility of charge carriers. In an OLED, for example, the emission of photons may depend on the creation of an electric current within the device, which may be correlated to the motion of charge carriers to and from electrodes. Charge carrier mobility in transistors, on the other hand, may determine how fast the device can be switched on and off.

Charge carrier mobility is the speed (cm/s) at which charge carriers move in a material along a given direction under an applied electric field (V/cm).

As will be appreciated, charge carrier mobility may be increased by increasing the electronic coupling between adjacent units, i.e., molecules, polymer segments, or crystals. Charge carrier mobility within an organic semiconductor may depend on the structure or morphology of the material.

Organic semiconductor materials having planar π-conjugated cores generally show efficient charge transport along the π-π stacking direction. Organic molecules may aggregate according to intermolecular interactions and may tend to exhibit an edge-on molecular orientation on common substrates. With an edge-on orientation, molecular planes may be parallel to the substrate surface, which may be along the desired direction of current flow. Thus, an edge-on orientation may be suitable for in-plane charge transport in organic field effect transistors (OFETs), resulting in high charge carrier mobility. A face-on molecular orientation, on the other hand, with molecular planes oriented orthogonal to the substrate, may be beneficial for out-of-plane charge transport, where charges flow perpendicular to the substrate.

Template layering techniques may be used to control the molecular orientation of organic semiconductor layers, e.g., from edge-on to face-on or vice versa, as well as intermediate orientations, without changing the molecular structure, and thus impact the mobility of charge carriers along a particular direction, e.g., between the source and drain of an OFET.

A templating layer may include a photoalignment layer and an organic semiconductor layer may be formed directly over the photoalignment layer after exposing the photoalignment layer to polarized light. Exposure to polarized light can establish the orientation of the photoalignment layer and hence the orientation of the over-formed organic semiconductor.

In accordance with various embodiments, an organic semiconductor layer may include one or a combination of polycyclic aromatic hydrocarbons, such as naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1,4-dicarboxylic acid, diphenylacetylene, N-(4-nitrophenyl)-(s)-prolinal, 4,5-dicyanoimidazole, benzodithiophene, cyanopyridine, thienothiophene, stilbene, azobenzene, and derivatives thereof.

In some embodiments, an organic semiconductor layer may include one or a combination of ring-structured materials, including ring-structured molecules such as cyclohexane, cyclopentane, tetrahydropyran, piperidine, tetrahydrofuran, pyrrolidine, tetrahydrothiophene, and their derivatives. Further example ring-structured materials include thiophene, bi-phenyl, tolane, benzimidazole, diphenylacetylene, cyanopyridine, dibenzothiophene, carbazole, silafluorene, and derivatives thereof. As disclosed further herein, any of the presently-disclosed molecules may include one or more terminal groups, such as C1-C10 alkyl, alkoxy, or alkenyl groups, —CN, —NCS, —SCN, —SF$_5$, —Br, —Cl, —F, —OCF$_3$, —CF$_3$, and mono- or polyfluorinated C1-C10 alkyl or alkoxy group.

Still further organic semiconductor materials may include crystalline polymers having aromatic hydrocarbon or heteroarene groups and their derivatives. Example include polyethylene naphthalate, poly (vinyl phenyl sulfide), poly (a-methylstyrene, polythienothiophene, polythiophene, poly (n-vinylphtalimide), parylene, polysulfide, polysulfone, poly(bromophenyl), poly(vinylnaphthalene), and liquid crystal polymers having one or more functional groups as disclosed herein.

Organic semiconductor materials may include amorphous polymers having aliphatic, heteroaliphatic, aromatic hydrocarbon or heteroarene groups (e.g., polystyrene), and may include a binder and/or further additives such as fatty acid, sugars, lipids, plasticizers, and surfactants (e.g., molecules with mono- or polyfluorinated alkyl or alkoxy groups).

Photoalignment is a technique for orienting selected materials to a desired alignment by exposure to polarized light. Photo-aligning materials may contain photosensitive species with angularly dependent absorption. In liquid crystal (LC) systems, for example, molecules may exhibit substantial re-orientational autonomy, and photoreactions may trigger changes in the packing state or the collective molecular alignment.

Example photoalignment compositions may include azo-compounds, polyimides, polysilanes, polystyrenes, polyesters, cinnamates, coumarins, chalconyls, tetrahydrophthalimides, and maleimides.

The one or more organic semiconductor layers and the one or more photoalignment layers may be formed using a variety of methods as will be appreciated by those skilled in the art, such as solvent-based methods including ink-jet printing, blade coating, spin coating, dip coating, etc. The organic semiconductor layer(s) and the photoalignment layer(s) may be formed using the same method or using different methods. Further example methods include physical vapor transport processes. A zone-annealing step may be implemented to decrease the population of crystalline defects, which may improve charge carrier mobility. In accordance with some embodiments, a stack of alternating organic semiconductor layers and photoalignment layers may form a channel structure of an organic field effect transistor.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-17, detailed descriptions of organic field effect transistors having a multilayer channel structure that includes one or more organic semiconductor layers that are each templated by a respective photoalignment layer. The discussion associated with FIGS. 1-4 includes a description of example OFET architectures. The discussion associated with FIGS. 5-15 includes a description of various materials that may be incorporated into the organic semiconductor layer(s). The discussion associated with FIGS. 16 and 17 relates to various virtual reality platforms that may include a display device as described herein.

Referring to FIG. 1, illustrated is a cross-sectional view of an example OFET. OFET 100 may be used in a variety of applications, including integrated circuits, displays, biosensors, and memory devices. The OFET 100 includes a substrate 110. Substrate 110 may include a semiconductor such as silicon (Si) or gallium arsenide (GaAs), although other materials may be used, including plastics and polymers such as polyester, polyimide, or polyamide.

A gate structure 120 overlies substrate 110. The gate structure 120 may include a gate 122 and a gate dielectric 124 overlying the gate. The gate 122 may include any suitable conductive material, such as silver, platinum, or gold, or a conductive polymer. The gate dielectric 124 may include silicon dioxide or aluminum oxide, for example.

OFET 100, which may be a bottom contact OFET, also includes a source 132 and a drain 134 overlying the gate dielectric 124 and spaced apart to define an active area 150. A channel structure 140 extends through the active area 150 and includes a photoalignment layer 141 and an organic semiconductor layer 142 disposed directly over the photoalignment layer 141. According to various embodiments, within the active area 150, the organic semiconductor layer 142 may be characterized by a charge carrier mobility gradient along the direction of its thickness, i.e., perpendicular to the direction between the source 132 and the drain 134. Gate 122 may be located proximate to active area 150. In the OFET of FIG. 1, the channel structure 140 may be deposited after the source and drain electrodes 132, 134, which may lessen the propensity for degradation of the organic semiconductor layer 142 during its formation.

Referring to FIG. 2, illustrated is a cross-sectional view of a further example OFET. The OFET 200, which may be a top contact OFET, includes a substrate 210 and a gate structure 220 embedded within the substrate 210. Gate structure 220 may include a gate 222 and a gate dielectric 224 overlying the gate 222.

Overlying the embedded gate structure 220, OFET 200 may include a channel structure 240. Channel structure 240 includes a photoalignment layer 241 and an organic semiconductor layer 242 disposed directly over the photoalignment layer 241. A source 232 and a drain 234 are disposed over the organic semiconductor layer 242 and spaced apart to define an active area 250. The organic semiconductor layer 242 may be characterized by a charge carrier mobility gradient along the direction of its thickness, i.e., perpendicular to the direction between the source 132 and the drain 134 within the active area 150. In the top contact OFET of FIG. 2, at least a portion of the organic semiconductor layer 242 is disposed between the substrate 210 and the source and drain 232, 234.

Referring to FIG. 3, shown is an example OFET having a multilayer channel structure. OFET 300 includes a substrate 310 and a gate structure 320 overlying the substrate 310. The gate structure 320 may include a gate 322 and a gate dielectric 324 overlying the gate. OFET 300 also includes a source 332 and a drain 334 overlying the gate dielectric 324 and spaced apart to define an active area 350.

A multilayer channel structure 340 extends through the active area 350 and includes alternating photoalignment and organic semiconductor layers where, from bottom to top, each successive organic semiconductor layer 342, 344, 346 directly overlies a corresponding photoalignment layer 341, 343, 345. According to various embodiments, within the active area 350, the organic semiconductor layers may be characterized by an interlayer gradient in charge carrier mobility.

Gate 322 may be located proximate to active area 350 and may be configured to control the conductivity of the organic semiconductor layers within the active area. In the OFET of FIG. 3, each layer within the channel structure 340 may be deposited after the source and drain electrodes 332, 334, which may lessen the propensity for degradation of the organic semiconductor layers 342, 344, 346 during their formation.

Figure 4:
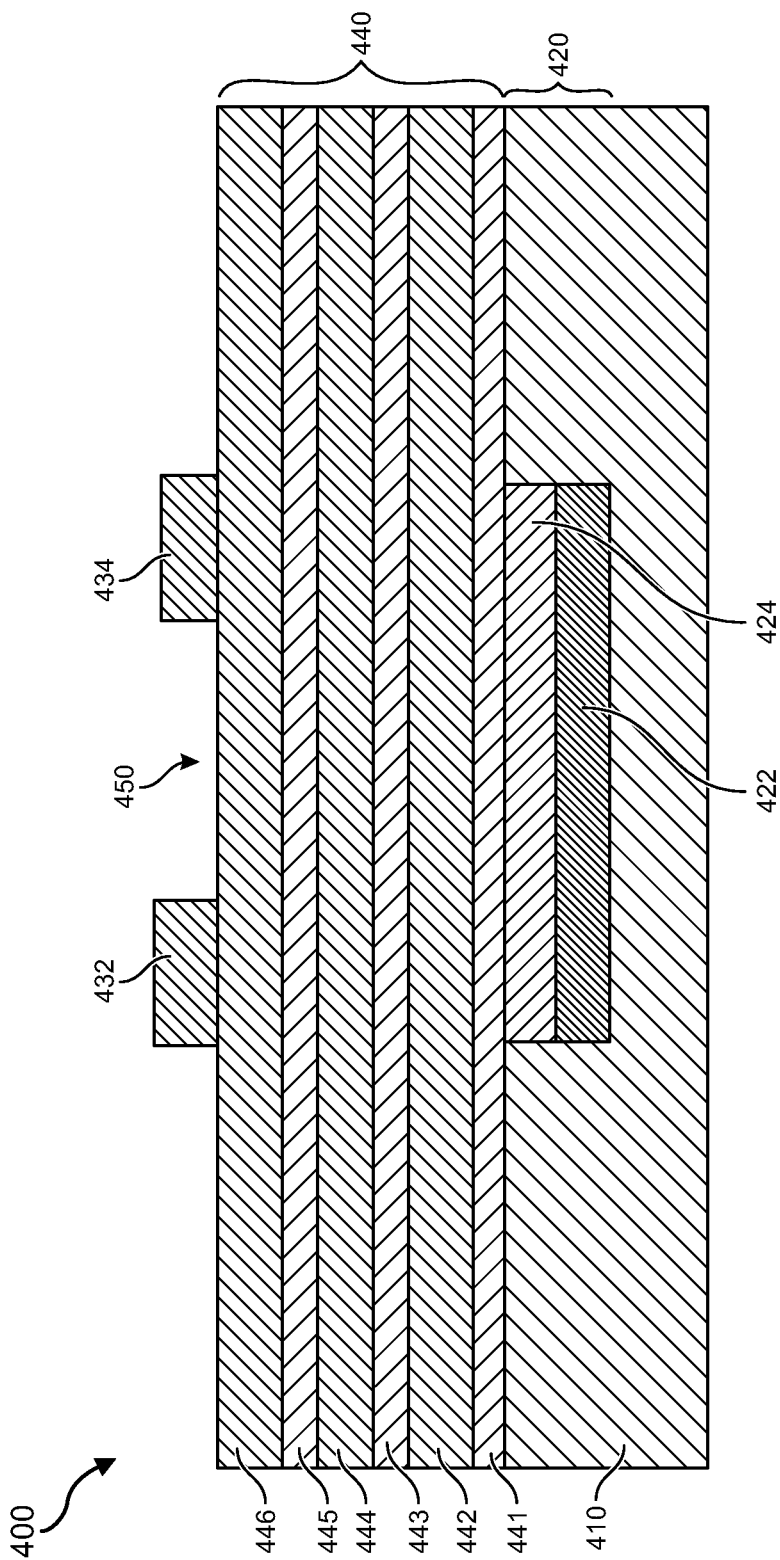
FIG. 4 is a cross-sectional schematic illustration of an organic field effect transistor having a multilayer templated channel structure according to some embodiments.

Turning to FIG. 4, shown is a cross-sectional view of a further OFET. OFET 400 includes a substrate 410 and a gate structure 420 embedded within the substrate 410. Gate structure 420 may include a gate 422 and a gate dielectric 424 overlying the gate 422.

Overlying the embedded gate structure 420, OFET 400 includes a multilayer channel structure 440. Channel structure 440 includes an alternating stack of photoalignment layers 441, 443, 445 and organic semiconductor layers 442, 444, 446, each disposed directly over a corresponding photoalignment layer. A source 432 and a drain 434, which are spaced apart to define an active area 450, may be disposed over the top-most organic semiconductor layer 446. The OFET 400 may be characterized by an interlayer gradient in charge carrier mobility, i.e., amongst the organic semiconductor layers 442, 444, 446 within the active area 450. In the top contact OFET of FIG. 4, at least a portion of each of the organic semiconductor layers 442, 444, 446 is disposed between the substrate 410 and the source and drain 432, 434.

Example molecules that may be used to form the organic semiconductor layer(s) are shown in FIGS. 5-14. The illustrated materials may be used as enantiomerically pure compositions or as racemic mixtures and may be used alone or in any combination. In the illustrated structures, "R" may include any suitable functional group, including but not limited to, $CH_3$, H, OH, OMe, OEt, OiPr, F, Cl, Br, I, Ph, $NO_2$, $SO_3$, $SO_2Me$, i-Pr, Pr, t-Bu, sec-Bu, Et, acetyl, SH, SMe, carboxyl, aldehyde, amide, amine, nitrile, ester, $SO_2NH_3$, $NH_2$, $NMe_2$, NMeH, and $C_2H_2$, and "n" may be any integral value from 0 to 4 inclusive.

Figure 5:
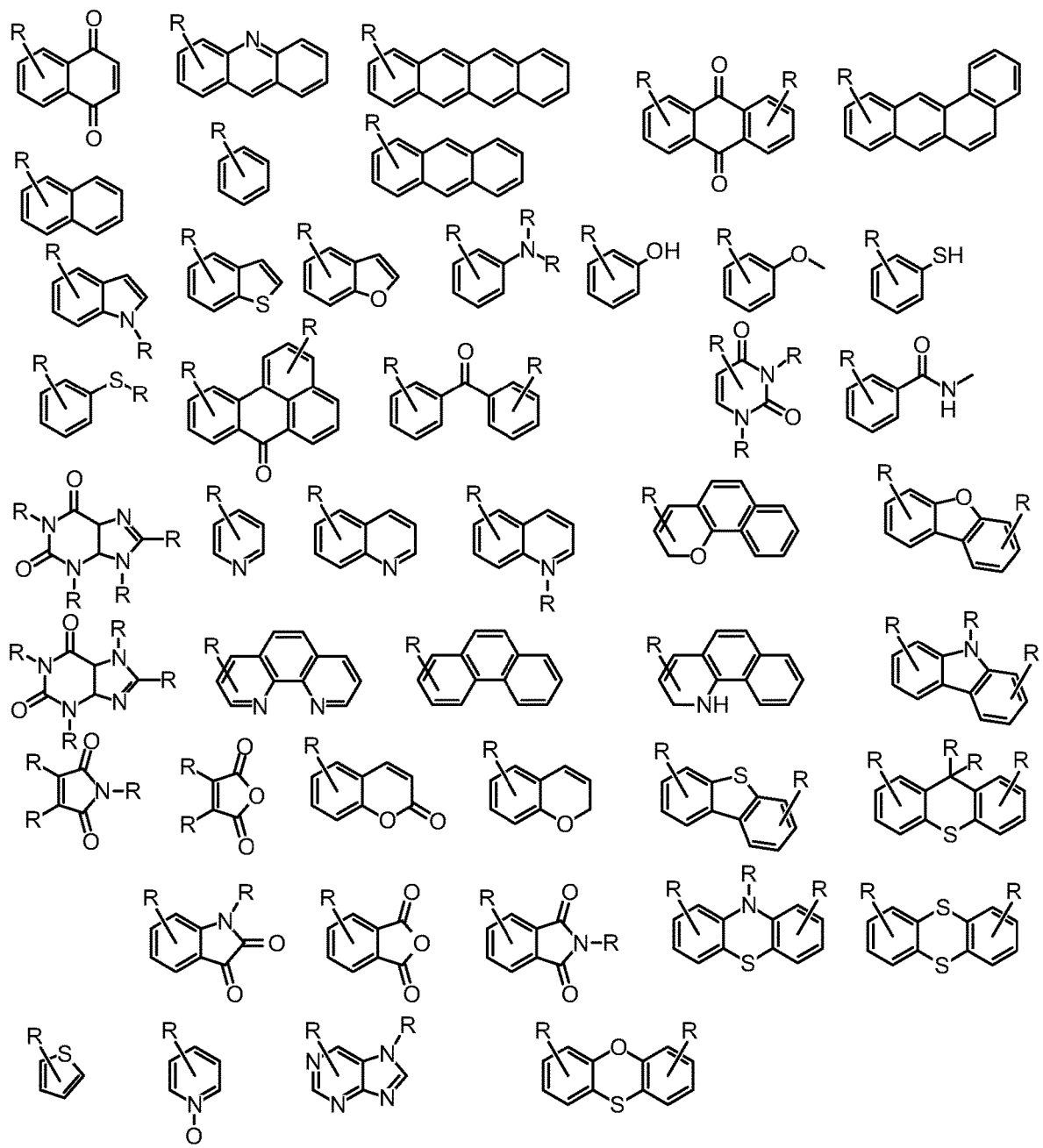
Figure 6:
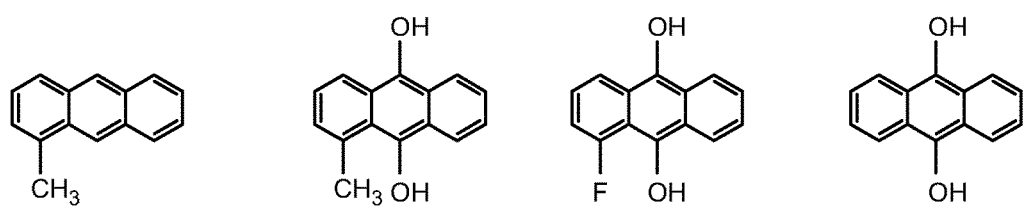
Figure 7:
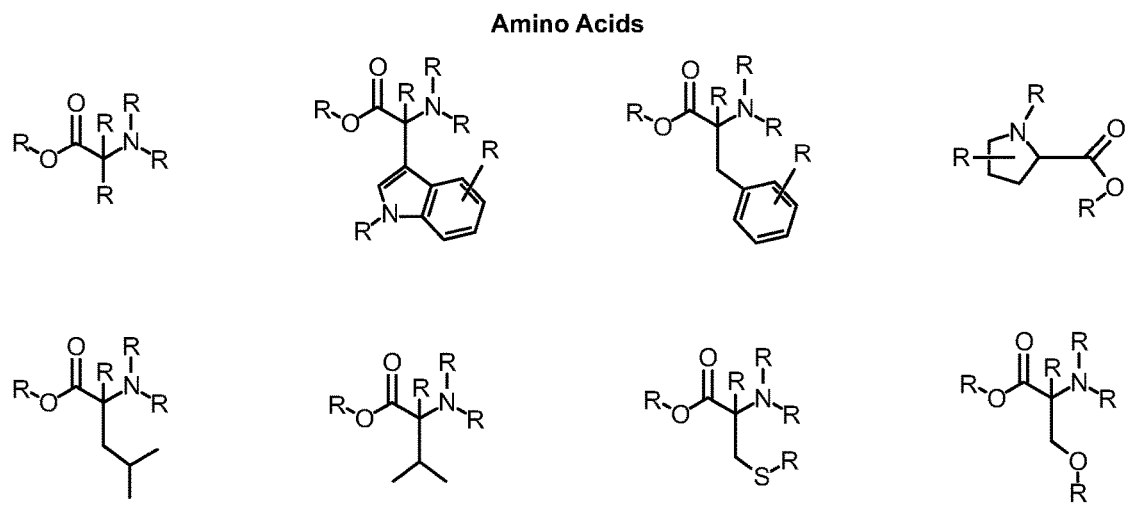
Figure 8:
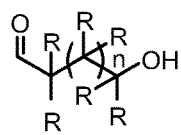
Figure 9:
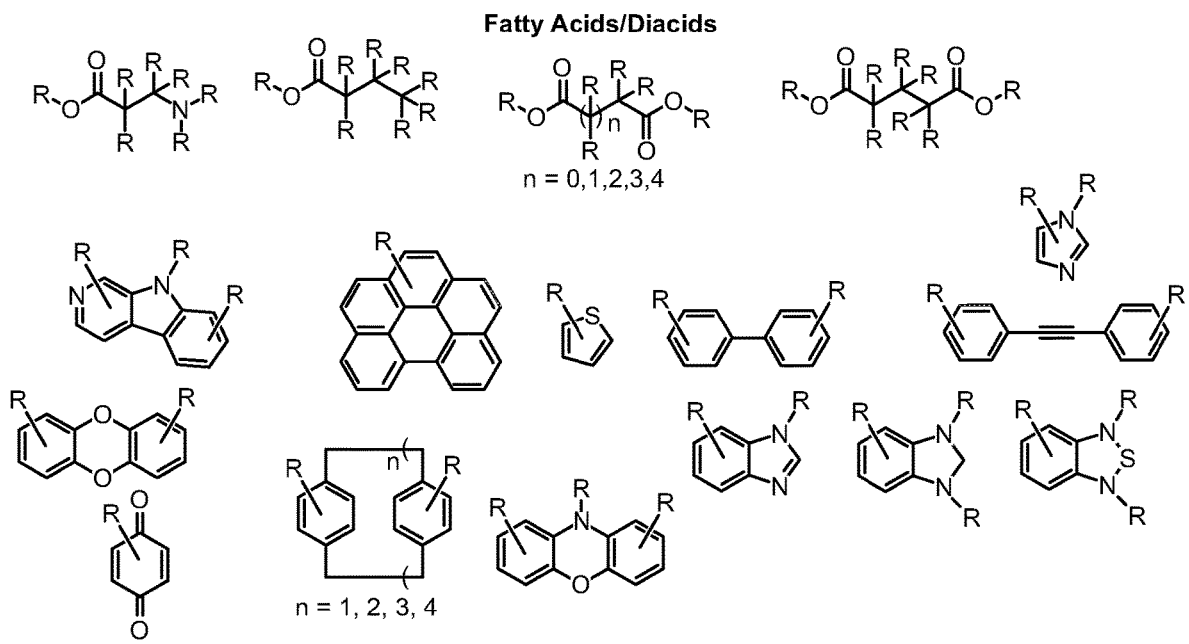
Figure 11:
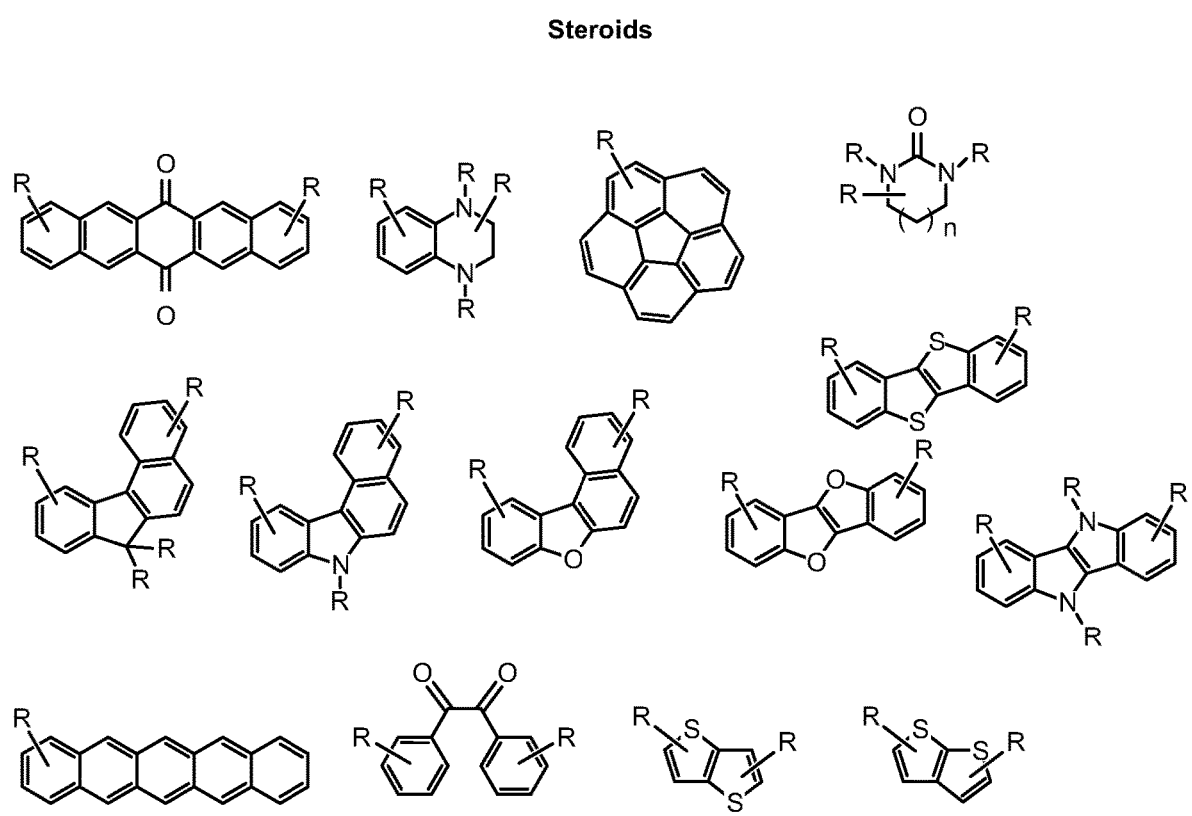

Various example molecules are shown in FIG. 5. Particular example compositions showing the addition of methyl-, hydroxyl-, and fluoro-functional groups to anthracene are shown in FIG. 6. Example amino acids are shown in FIG. 7, example sugars are shown in FIG. 8, and example fatty acids are shown in FIG. 9. As further examples, suitable hydrocarbons are shown in FIG. 10 and suitable steroid compositions are shown in FIG. 11.

Figure 12:
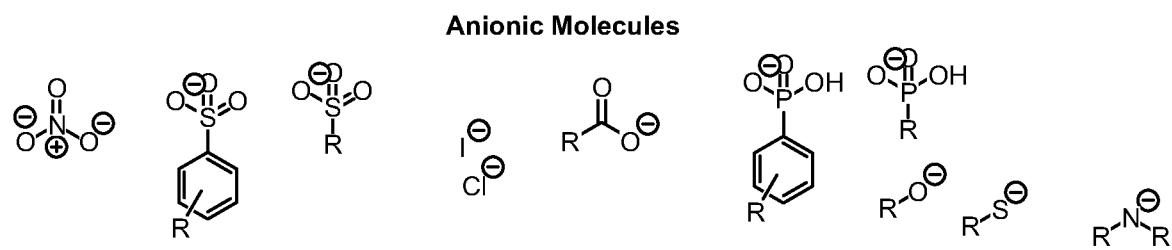
Figure 13:
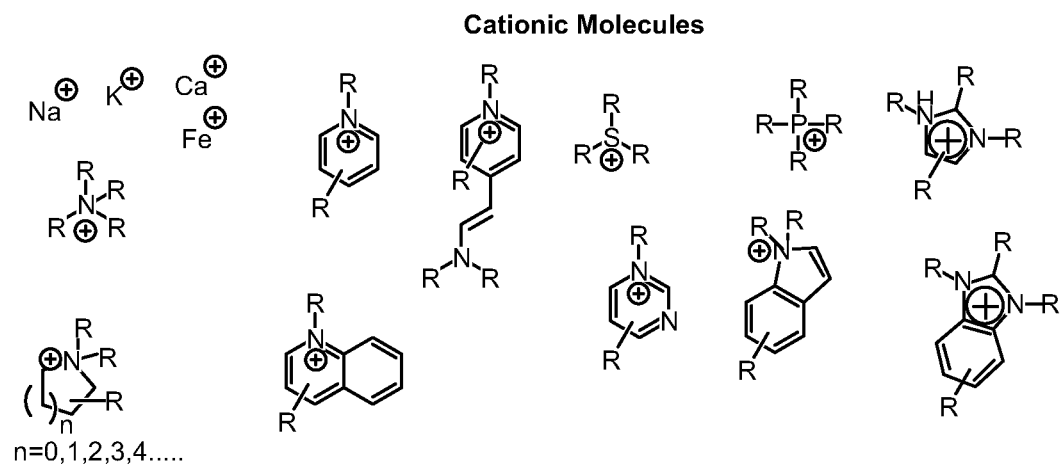

Referring to FIGS. 12 and 13, shown are example anionic molecules and cationic molecules, respectively. Referring to FIG. 14, a modular molecular structure (A-B-C-D-E) is shown, where the individual moieties (A, B, C, D, and E) may be selected in any combination. Exemplary molecules that may be used to form the organic semiconductor layer are shown in FIG. 15. The molecules illustrated in FIG. 15 may be processed to form large crystals at relatively high growth rates while having fewer overall defects and may be used to form an OFET characterized by a high charge mobility.

As disclosed herein, an organic field effect transistor (OFET) includes a channel located between a source and a drain where the channel is formed from one or more layers of an organic semiconductor. The organic semiconductor layer(s) may include a single crystal material or a polycrystalline material, for example. In accordance with certain embodiments, a photoalignment layer may be used to template the growth of each respective organic semiconductor layer in a multilayer stack and accordingly influence the orientation of the crystalline phase.

As will be appreciated, the crystalline orientation may influence the carrier mobility within a given layer. As disclosed herein, an OFET channel may include a multilayer architecture that includes alternating layers of an organic semiconductor and a photoalignment layer. According to particular embodiments, the photoalignment layers may be configured to form an interlayer gradient in the carrier mobility amongst the organic semiconductor layers, such that the carrier mobility progressively changes throughout the multilayer stack. The multilayer structure may advantageously maintain or increase carrier mobility within the channel while decreasing the OFF current of the device.

EXAMPLE EMBODIMENTS

Example 1: An organic field effect transistor has a channel structure including a photoalignment layer and an organic semiconductor layer disposed directly over the photoalignment layer, where a charge carrier mobility varies along a thickness direction of the channel structure.

Example 2: The organic field effect transistor of Example 1, where the organic semiconductor layer is characterized by an intra layer gradient in charge carrier mobility.

Example 3: The organic field effect transistor of any of Examples 1 and 2, where the photoalignment layer includes a material selected from the azo-compounds, polyimides, polysilanes, polystyrenes, polyesters, cinnamates, coumarins, chalconyls, tetrahydrophthalimides, and maleimides.

Example 4: The organic field effect transistor of any of Examples 1-3, where the photoalignment layer is configured to influence an orientation of molecules within the organic semiconductor layer.

Example 5: The organic field effect transistor of any of Examples 1-4, where the organic semiconductor layer includes a polycrystalline layer or a single crystal layer.

Example 6: The organic field effect transistor of any of Examples 1-5, where the organic semiconductor layer includes a polycyclic aromatic hydrocarbon.

Example 7: The organic field effect transistor of any of Examples 1-6, where the organic semiconductor layer includes a molecule selected from naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1,4-dicarboxylic acid, diphenylacetylene, N-(4-nitrophenyl)-(s)-prolinal, 4,5-dicyanoimidazole, benzodithiophene, cyanopyridine, thienothiophene, stilbene, and azobenzene.

Example 8: The organic field effect transistor of any of Examples 1-7, further including a source located adjacent to a first region of the channel structure and a drain located adjacent to a second region of the channel structure, where the channel structure defines an active area located between the source and the drain.

Example 9: The organic field effect transistor of any of Examples 1-8, where the channel structure includes alternating layers of at least two photoalignment layers and at least two organic semiconductor layers.

Example 10: The organic field effect transistor of Example 9, where the organic semiconductor layers are characterized by an interlayer gradient in charge carrier mobility.

Example 11: The organic field effect transistor of any of Examples 9 and 10, where a charge carrier mobility within the organic semiconductor layers progressively increases from a bottom of the channel structure to a top of the channel structure.

Example 12: A method includes forming a first photoalignment layer, illuminating the first photoalignment layer with polarized light to form a first oriented photoalignment layer, forming a first organic semiconductor layer directly over the first oriented photoalignment layer, forming a second photoalignment layer over the first organic semiconductor layer, illuminating the second photoalignment layer with polarized light to form a second oriented photoalignment layer, and forming a second organic semiconductor layer directly over the second oriented photoalignment layer.

Example 13: The method of Example 12, where the photoalignment layers each include a material independently selected from the azo-compounds, polyimides, polysilanes, polystyrenes, polyesters, cinnamates, coumarins, chalconyls, tetrahydrophthalimides, and maleimides.

Example 14: The method of any of Examples 12 and 13, where the organic semiconductor layers each include a polycyclic aromatic hydrocarbon.

Example 15: The method of any of Examples 12-14, where the organic semiconductor layers each independently include a molecule selected from naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1, 4-dicarboxylic acid, diphenylacetylene, N-(4-nitrophenyl)-(s)-prolinal, 4,5-dicyanoimidazole, benzodithiophene, cyanopyridine, thienothiophene, stilbene, and azobenzene.

Example 16: The method of any of Examples 12-15, further including forming a source adjacent to a first region of the first organic semiconductor layer, and forming a drain adjacent to a second region of the first organic semiconductor layer, where a charge carrier mobility of the organic semiconductor layers within an active area between the source and the drain is characterized by an interlayer gradient.

Example 17: An organic field effect transistor includes a first photoalignment layer disposed over a substrate, a first organic semiconductor layer disposed directly over the first photoalignment layer, a second photoalignment layer disposed over the first organic semiconductor layer, and a second organic semiconductor layer disposed directly over the second photoalignment layer, where a charge carrier mobility within the first organic semiconductor layer is different than a charge carrier mobility within the second organic semiconductor layer.

Example 18: The organic field effect transistor of Example 17, where an orientation of molecules within the first organic semiconductor layer is different than an orientation of molecules within the second organic semiconductor layer.

Example 19: The organic field effect transistor of any of Examples 17 and 18, further including a source disposed over a first region of the substrate, and a drain disposed over a second region of the substrate, where the first and second organic semiconductor layers define an active area between the source and the drain.

Example 20: The organic field effect transistor of Example 19, further including a gate structure configured to control the conductivity of the first and second organic semiconductor layers within the active area.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 1600 in FIG. 16) or that visually immerses a user in an artificial reality (e.g., virtual-reality system 1700 in FIG. 17). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 16:
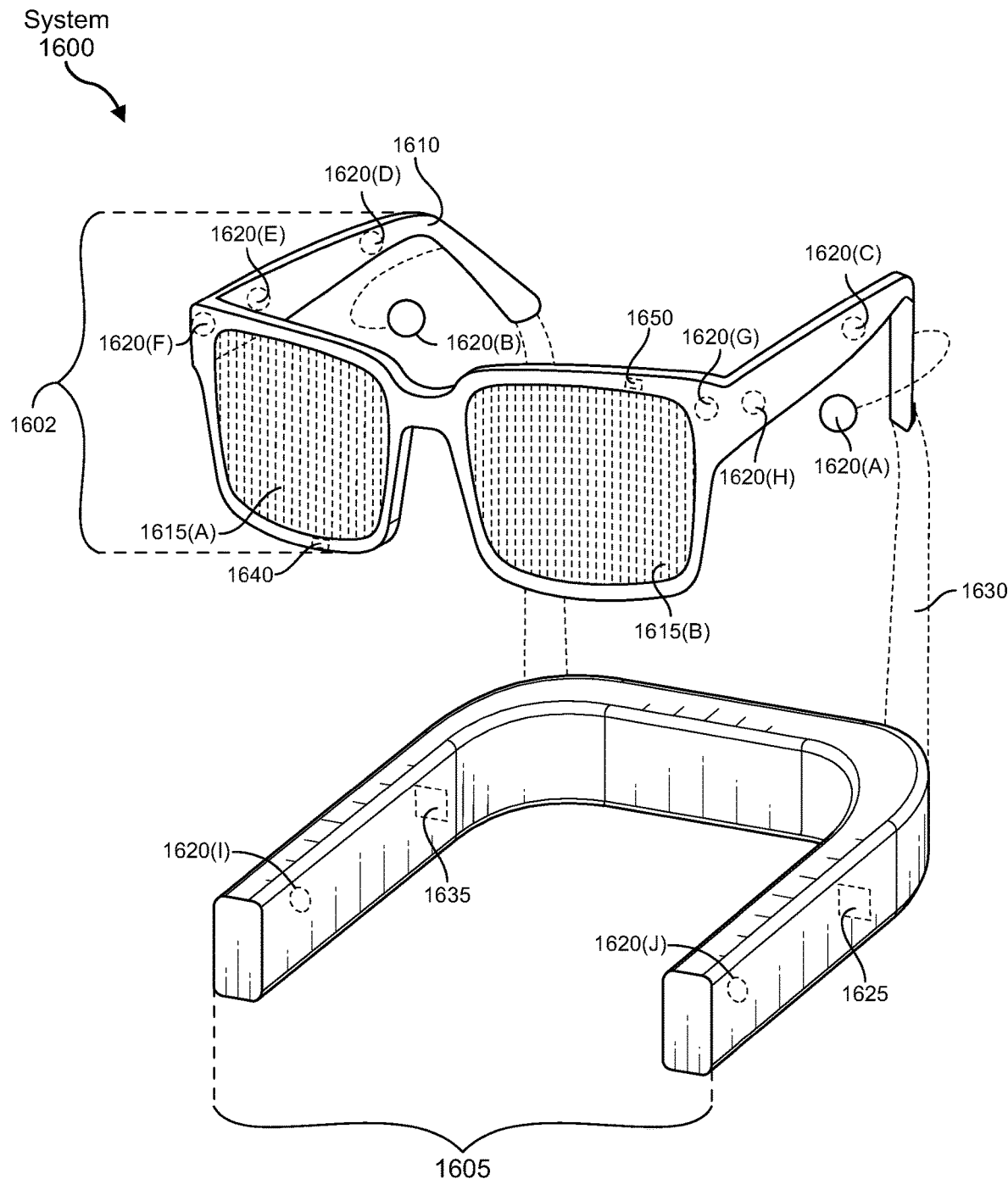
FIG. 16 is an illustration of exemplary augmented-reality glasses that may be used in connection with embodiments of this disclosure.
Figure 17:
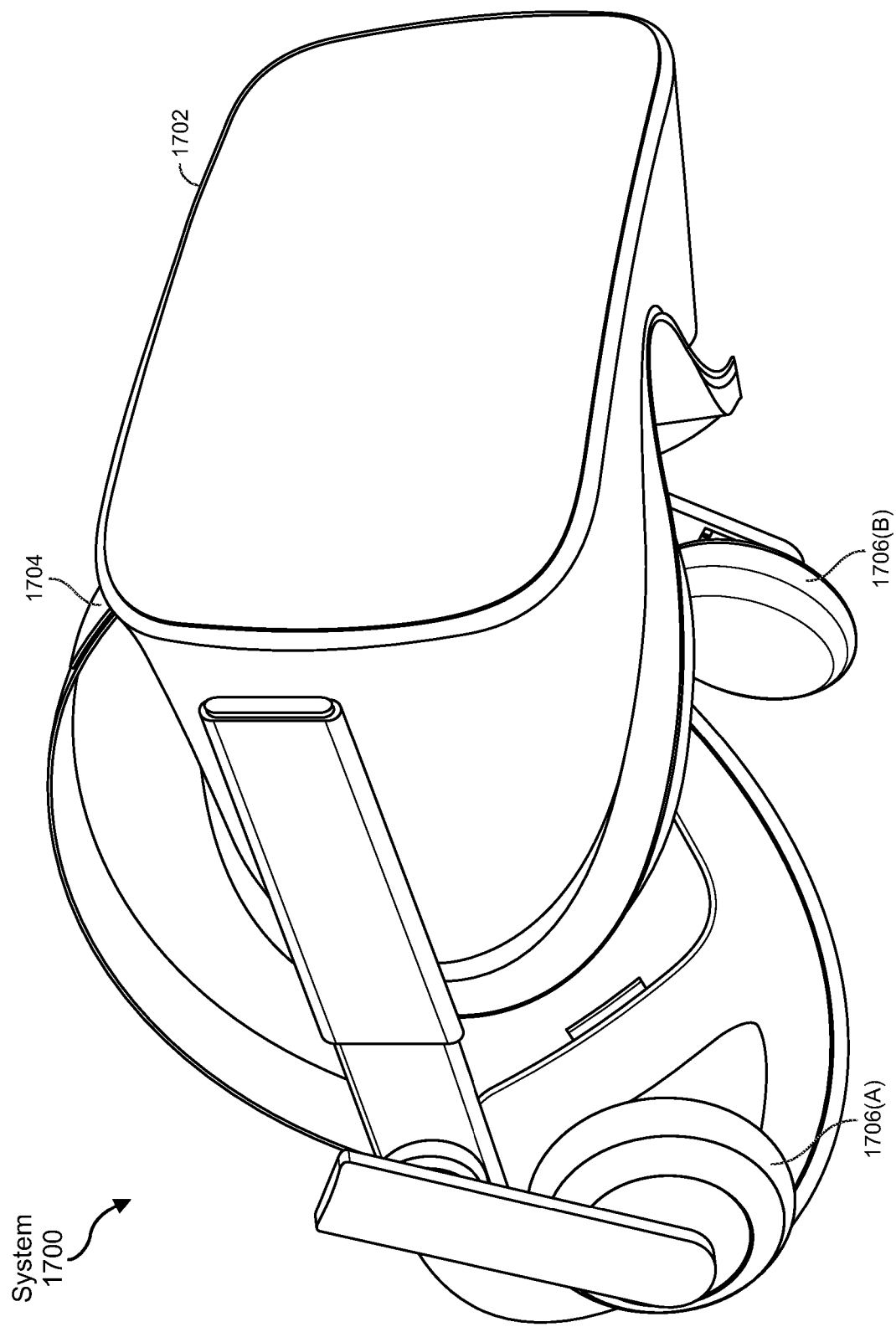
FIG. 17 is an illustration of an exemplary virtual-reality headset that may be used in connection with embodiments of this disclosure.

Turning to FIG. 16, augmented-reality system 1600 may include an eyewear device 1602 with a frame 1610 configured to hold a left display device 1615(A) and a right display device 1615(B) in front of a user's eyes. Display devices 1615(A) and 1615(B) may act together or independently to present an image or series of images to a user. While augmented-reality system 1600 includes two displays, embodiments of this disclosure may be implemented in augmented-reality systems with a single NED or more than two NEDs.

In some embodiments, augmented-reality system 1600 may include one or more sensors, such as sensor 1640. Sensor 1640 may generate measurement signals in response to motion of augmented-reality system 1600 and may be located on substantially any portion of frame 1610. Sensor 1640 may represent a position sensor, an inertial measurement unit (IMU), a depth camera assembly, a structured light emitter and/or detector, or any combination thereof. In some embodiments, augmented-reality system 1600 may or may not include sensor 1640 or may include more than one sensor. In embodiments in which sensor 1640 includes an IMU, the IMU may generate calibration data based on measurement signals from sensor 1640. Examples of sensor 1640 may include, without limitation, accelerometers, gyroscopes, magnetometers, other suitable types of sensors that detect motion, sensors used for error correction of the IMU, or some combination thereof.

Augmented-reality system 1600 may also include a microphone array with a plurality of acoustic transducers 1620(A)-1620(J), referred to collectively as acoustic transducers 1620. Acoustic transducers 1620 may be transducers that detect air pressure variations induced by sound waves. Each acoustic transducer 1620 may be configured to detect sound and convert the detected sound into an electronic format (e.g., an analog or digital format). The microphone array in FIG. 16 may include, for example, ten acoustic transducers: 1620(A) and 1620(B), which may be designed to be placed inside a corresponding ear of the user, acoustic transducers 1620(C), 1620(D), 1620(E), 1620(F), 1620(G), and 1620(H), which may be positioned at various locations on frame 1610, and/or acoustic transducers 1620(I) and 1620(J), which may be positioned on a corresponding neckband 1605.

In some embodiments, one or more of acoustic transducers 1620(A)-(F) may be used as output transducers (e.g., speakers). For example, acoustic transducers 1620(A) and/or 1620(B) may be earbuds or any other suitable type of headphone or speaker.

The configuration of acoustic transducers 1620 of the microphone array may vary. While augmented-reality system 1600 is shown in FIG. 16 as having ten acoustic transducers 1620, the number of acoustic transducers 1620 may be greater or less than ten. In some embodiments, using higher numbers of acoustic transducers 1620 may increase the amount of audio information collected and/or the sensitivity and accuracy of the audio information. In contrast, using a lower number of acoustic transducers 1620 may decrease the computing power required by an associated controller 1650 to process the collected audio information. In addition, the position of each acoustic transducer 1620 of the microphone array may vary. For example, the position of an acoustic transducer 1620 may include a defined position on the user, a defined coordinate on frame 1610, an orientation associated with each acoustic transducer 1620, or some combination thereof.

Acoustic transducers 1620(A) and 1620(B) may be positioned on different parts of the user's ear, such as behind the pinna, behind the tragus, and/or within the auricle or fossa. Or, there may be additional acoustic transducers 1620 on or surrounding the ear in addition to acoustic transducers 1620 inside the ear canal. Having an acoustic transducer 1620 positioned next to an ear canal of a user may enable the microphone array to collect information on how sounds arrive at the ear canal. By positioning at least two of acoustic transducers 1620 on either side of a user's head (e.g., as binaural microphones), augmented-reality device 1600 may simulate binaural hearing and capture a 3D stereo sound field around about a user's head. In some embodiments, acoustic transducers 1620(A) and 1620(B) may be connected to augmented-reality system 1600 via a wired connection 1630, and in other embodiments acoustic transducers 1620(A) and 1620(B) may be connected to augmented-reality system 1600 via a wireless connection (e.g., a Bluetooth connection). In still other embodiments, acoustic transducers 1620(A) and 1620(B) may not be used at all in conjunction with augmented-reality system 1600.

Acoustic transducers 1620 on frame 1610 may be positioned along the length of the temples, across the bridge, above or below display devices 1615(A) and 1615(B), or some combination thereof. Acoustic transducers 1620 may be oriented such that the microphone array is able to detect sounds in a wide range of directions surrounding the user wearing the augmented-reality system 1600. In some embodiments, an optimization process may be performed during manufacturing of augmented-reality system 1600 to determine relative positioning of each acoustic transducer 1620 in the microphone array.

In some examples, augmented-reality system 1600 may include or be connected to an external device (e.g., a paired device), such as neckband 1605. Neckband 1605 generally represents any type or form of paired device. Thus, the following discussion of neckband 1605 may also apply to various other paired devices, such as charging cases, smart watches, smart phones, wrist bands, other wearable devices, hand-held controllers, tablet computers, laptop computers, other external compute devices, etc.

As shown, neckband 1605 may be coupled to eyewear device 1602 via one or more connectors. The connectors may be wired or wireless and may include electrical and/or non-electrical (e.g., structural) components. In some cases, eyewear device 1602 and neckband 1605 may operate independently without any wired or wireless connection between them. While FIG. 16 illustrates the components of eyewear device 1602 and neckband 1605 in example locations on eyewear device 1602 and neckband 1605, the components may be located elsewhere and/or distributed differently on eyewear device 1602 and/or neckband 1605. In some embodiments, the components of eyewear device 1602 and neckband 1605 may be located on one or more additional peripheral devices paired with eyewear device 1602, neckband 1605, or some combination thereof.

Pairing external devices, such as neckband 1605, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1600 may be provided by a paired device or shared between a paired device and an eyewear device, thus reducing the weight, heat profile, and form factor of the eyewear device overall while still retaining desired functionality. For example, neckband 1605 may allow components that would otherwise be included on an eyewear device to be included in neckband 1605 since users may tolerate a heavier weight load on their shoulders than they would tolerate on their heads. Neckband 1605 may also have a larger surface area over which to diffuse and disperse heat to the ambient environment. Thus, neckband 1605 may allow for greater battery and computation capacity than might otherwise have been possible on a stand-alone eyewear device. Since weight carried in neckband 1605 may be less invasive to a user than weight carried in eyewear device 1602, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1605 may be communicatively coupled with eyewear device 1602 and/or to other devices. These other devices may provide certain functions (e.g., tracking, localizing, depth mapping, processing, storage, etc.) to augmented-reality system 1600. In the embodiment of FIG. 16, neckband 1605 may include two acoustic transducers (e.g., 1620(I) and 1620(J)) that are part of the microphone array (or potentially form their own microphone subarray). Neckband 1605 may also include a controller 1625 and a power source 1635.

Acoustic transducers 1620(I) and 1620(J) of neckband 1605 may be configured to detect sound and convert the detected sound into an electronic format (analog or digital). In the embodiment of FIG. 16, acoustic transducers 1620(I) and 1620(J) may be positioned on neckband 1605, thereby increasing the distance between the neckband acoustic transducers 1620(I) and 1620(J) and other acoustic transducers 1620 positioned on eyewear device 1602. In some cases, increasing the distance between acoustic transducers 1620 of the microphone array may improve the accuracy of beamforming performed via the microphone array. For example, if a sound is detected by acoustic transducers 1620(C) and 1620(D) and the distance between acoustic transducers 1620(C) and 1620(D) is greater than, e.g., the distance between acoustic transducers 1620(D) and 1620(E), the determined source location of the detected sound may be more accurate than if the sound had been detected by acoustic transducers 1620(D) and 1620(E).

Controller 1625 of neckband 1605 may process information generated by the sensors on neckband 1605 and/or augmented-reality system 1600. For example, controller 1625 may process information from the microphone array that describes sounds detected by the microphone array. For each detected sound, controller 1625 may perform a direction-of-arrival (DOA) estimation to estimate a direction from which the detected sound arrived at the microphone array. As the microphone array detects sounds, controller 1625 may populate an audio data set with the information. In embodiments in which augmented-reality system 1600 includes an inertial measurement unit, controller 1625 may compute all inertial and spatial calculations from the IMU located on eyewear device 1602. A connector may convey information between augmented-reality system 1600 and neckband 1605 and between augmented-reality system 1600 and controller 1625. The information may be in the form of optical data, electrical data, wireless data, or any other transmittable data form. Moving the processing of information generated by augmented-reality system 1600 to neckband 1605 may reduce weight and heat in eyewear device 1602, making it more comfortable to the user.

Power source 1635 in neckband 1605 may provide power to eyewear device 1602 and/or to neckband 1605. Power source 1635 may include, without limitation, lithium ion batteries, lithium-polymer batteries, primary lithium batteries, alkaline batteries, or any other form of power storage. In some cases, power source 1635 may be a wired power source. Including power source 1635 on neckband 1605 instead of on eyewear device 1602 may help better distribute the weight and heat generated by power source 1635.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1700 in FIG. 17, that mostly or completely covers a user's field of view. Virtual-reality system 1700 may include a front rigid body 1702 and a band 1704 shaped to fit around a user's head. Virtual-reality system 1700 may also include output audio transducers 1706(A) and 1706(B). Furthermore, while not shown in FIG. 17, front rigid body 1702 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1600 and/or virtual-reality system 1700 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 1600 and/or virtual-reality system 1700 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 1600 and/or virtual-reality system 1700 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 17, output audio transducers 1706(A) and 1706(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 16, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a photoalignment layer that comprises or includes an azo compound include embodiments where a photoalignment layer consists essentially of an azo compound and embodiments where a photoalignment layer consists of an azo compound.

What is claimed is:

1. An organic field effect transistor comprising:
   a channel structure comprising at least two photoalignment layers alternating with at least two organic semiconductor layers each disposed directly over a respective photoalignment layer, wherein a charge carrier mobility varies along a thickness direction of the channel structure.

2. The organic field effect transistor of claim 1, wherein the photoalignment layers comprise a material selected from the group consisting of azo-compounds, polyimides, polysilanes, polystyrenes, polyesters, cinnamates, coumarins, chalconyls, tetrahydrophthalimides, and maleimides.

3. The organic field effect transistor of claim 1, wherein the photoalignment layers are configured to influence an orientation of molecules within the organic semiconductor layers.

4. The organic field effect transistor of claim 1, wherein the organic semiconductor layers comprise a polycrystalline layer or a single crystal layer.

5. The organic field effect transistor of claim 1, wherein the organic semiconductor layers comprise a polycyclic aromatic hydrocarbon.

6. The organic field effect transistor of claim 1, wherein the organic semiconductor layers comprise a molecule selected from the group consisting of naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1, 4-dicarboxylic acid, diphenylacetylene, N-(4-nitrophenyl)-(s)-prolinal, 4,5-dicyanoimidazole, benzodithiophene, cyanopyridine, thienothiophene, stilbene, and azobenzene.

7. The organic field effect transistor of claim 1, further comprising a source located adjacent to a first region of the channel structure and a drain located adjacent to a second region of the channel structure, wherein the channel structure defines an active area located between the source and the drain.

8. The organic field effect transistor of claim 1, wherein the organic semiconductor layers are characterized by an interlayer gradient in charge carrier mobility.

9. The organic field effect transistor of claim 1, wherein a charge carrier mobility within the organic semiconductor layers progressively increases from a bottom of the channel structure to a top of the channel structure.

10. An organic field effect transistor comprising:
a first photoalignment layer disposed over a substrate;
a first organic semiconductor layer disposed directly over the first photoalignment layer;
a second photoalignment layer disposed over the first organic semiconductor layer; and
a second organic semiconductor layer disposed directly over the second photoalignment layer, wherein a charge carrier mobility within the first organic semiconductor layer is different than a charge carrier mobility within the second organic semiconductor layer.

11. The organic field effect transistor of claim 10, wherein an orientation of molecules within the first organic semiconductor layer is different than an orientation of molecules within the second organic semiconductor layer.

12. The organic field effect transistor of claim 10, further comprising:
a source disposed over a first region of the substrate; and
a drain disposed over a second region of the substrate, wherein the first and second organic semiconductor layers define an active area between the source and the drain.

13. The organic field effect transistor of claim 12, further comprising a gate structure configured to control the conductivity of the first and second organic semiconductor layers within the active area.

* * * * *